Dec. 30, 1958 T. O. STANLEY 2,866,859

AUDIO AMPLIFIER BRIDGE INPUT CIRCUITS

Filed July 11, 1955

INVENTOR:
THOMAS O. STANLEY
BY [signature]
ATTORNEY

United States Patent Office 2,866,859

Patented Dec. 30, 1958

2,866,859

AUDIO AMPLIFIER BRIDGE INPUT CIRCUITS

Thomas O. Stanley, Princeton, N. J., assignor to Radio Corporation of America, a corporation of Delaware Application July 11, 1955, Serial No. 521,015

2 Claims. (Cl. 179—171)

The present invention relates generally to semi-conductor signal translating circuits and particularly to improved coupling circuits therefor.

Semi-conductor signal amplifier devices such as transistors, at the present state of the art, have been found to be temperature sensitive. For this reason, it has been found that the static bias requirements for a transistor amplifier may vary in accordance with ambient temperature variations. The effective use of transistors, therefore, requires that a circuit arrangement be provided for either rigidly biasing the transistor to prevent emitter current variations or to provide an appropriate bias change to compensate for varying transistor characteristics. Rigid or degenerative biasing networks are generally useful in providing an essentially constant direct current bias which remains unaltered with temperature changes. However, many of the heretofore used degenerative networks also provide a loss in alternating current gain due to degeneration.

It is an object of the present invention to provide an improved input or coupling circuit for a transistor signal amplifier which affords stable operation while maintaining efficient coupling.

The response of the human ear to tones of various frequencies is such that tones of equal intensity appear to have different loudness depending on where they lie within the audible frequency spectrum. It has been determined that the response to tones lying within the two thousand to three thousand cycle per second range are those which are heard by the human mechanism with maximum efficiency at low intensities. The response to tones lying both above and below this range is appreciably lower than the response to tones lying within this range. Moreover, this variation in tone response increases with a general decrease in the intensity throughout the audible spectrum. It is, therefore, desirable to provide, in a signal amplifier circuit, a volume control which is tone compensated such that the distribution of the energy content appears to remain essentially constant at all volume levels.

It is accordingly a further object of the present invention to provide an improved tone compensated volume control for transistor signal amplifier circuits which affords efficient coupling at maximum volume settings while maintaining stable operation over a wide temperature range.

In addition to the above discussed tone compensation, it may be desirable to provide an adjustable frequency selective transmission network in order to compensate for variations in transducer ability, source material and acoustics.

It is a still further object of the present invention to provide an improved input coupling circuit enabling efficent stable operation of an audio frequency signal amplifier circuit while permitting an adjustable frequency selective signal translating characteristic.

In accordance with one aspect of the present invention, stable operation and efficient coupling is provided in a transistor signal amplifier by means of a bridge type of coupling network having a capacitive arm for preventing alternating current degeneration while permitting direct current degeneration for stabilizing the operation against temperature variations.

In accordance with a further aspect of the present invention, automatic tone compensation is provided by means of a resistance-capacitance network wherein the frequency response of the coupling network is simultaneously altered in accordance with the adjustment of the signal translating ability.

In accordance with a still further aspect of the present invention, tone control in a signal translating network is provided by means of a feedback circuit wherein adjustable frequency selective degeneration is provided.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
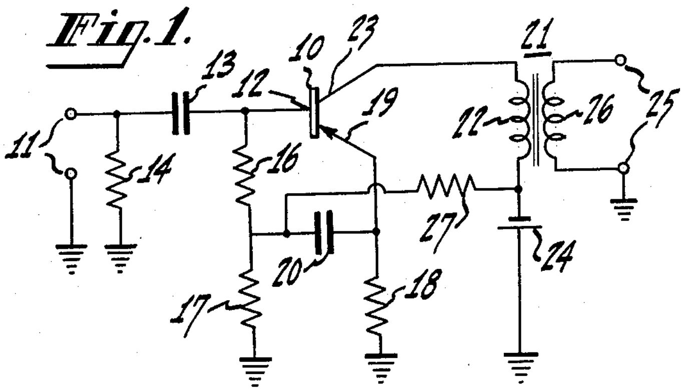
Figure 1 is a schematic circuit diagram of a transistor amplifier including an input coupling circuit network provided in accordance with the present invention.

Like circuit elements have been designated by the same reference characters throughout the drawing. Referring now to Figure 1, a semi-conductor device or transistor 10 of the PNP variety is provided with an input circuit comprising a pair of input terminals 11. One input terminal is connected to the base electrode 12 through a coupling capacitor 13. The other input terminal is connected directly to a point of fixed reference potential or signal ground. An impedance element illustrated as a resistor 14, which is connected between the input terminals 11, represents the source impedance of any convenient source of signal current which may be coupled to the input terminals 11. It is, of course, to be understood that the resistor 14 may not actually exist as a separate circuit element depending upon the particular signal source utilized.

A pair of base bias resistors 16 and 17 are connected in series arrangement between the base electrode 12 and signal ground to provide a direct current return path for the base electrode 12. An emitter resistor 18 is connected between the emitter electrode 19 and signal ground which, depending upon the resistance thereof provides direct current degeneration as will be more fully hereinafter discussed. Alternating current degeneration is prevented by means of a bridge capacitor 20 which is connected between the emitter electrode 19 and the junction of the base bias resistors 16 and 17.

An output circuit is provided by means of a transformer 21 having a primary winding 22 connected between the collector electrode 23 and the negative terminal of a source of direct current energizing voltage illustrated as a battery 24. The positive terminal of the battery 24 is connected to signal ground. A signal output voltage is developed across a pair of signal output terminals 25 of the transformer secondary winding 26.

A static base bias current is provided by means of a bias resistor 27 which is connected between the negative terminal of the battery 24 and the junction of the base bias resistors 16 and 17. The amount of static bias for the base electrode 12 is determined by the proportioning of the bias resistors 16, 17, 18 and 27. These elements are chosen so as to provide the desired mode of operation for the transistor 10.

In explaining the operation of the circuit it will be assumed that the circuit elements associated with the transistor 10 have been selected to provide class A or linear operation. Input signals which are applied to the input terminals 11 are, by virtue of the coupling capacitor 13 and the emitter resistor 18, applied between the base electrode 12 and the emitter electrode 19. The effect of these signals is to increase or decrease the current flow in the output circuit in accordance with the instantaneous signal amplitude. The output current flowing in the emitter-collector circuit develops a degenerative voltage across resistors 17 and 18 which tends to reduce the efficiency of coupling from the signal source to the transistor. Resistors 17 and 18 are effectively in parallel by virtue of the capacitor 20. The relative magnitude of the resistors 17 and 18 and the source impedance are chosen to minimize this reduction in efficiency. It is, of course, possible to utilize a capacitor connected in shunt with the emitter resistor 18 in order to avoid alternating current degeneration. However, it is noted that the capacitance of a shunt connected capacitor would have to be an order of magnitude larger than the capacitance required by the capacitor 20 to effectively provide the same immunity from alternating current degeneration.

The circuit configuration provided by the bias resistors 16 and 17, the emitter resistor 18 and the capacitor 20, is analagous to a bridge circuit. The capacitance of the capacitor 20 determines the low frequency cut-off of the amplifier. The low frequency portion of the compensated signal is developed across the capacitor 20 which constitutes the cross-arm portion of the bridge. This arrangement permits the use of a smaller capacitance than that which would be required as an emitter by-pass for the same low frequency cut-off while still achieving stability by virtue of the direct current degeneration introduced by the emitter resistor 18.

Figures 2, 3, 4:
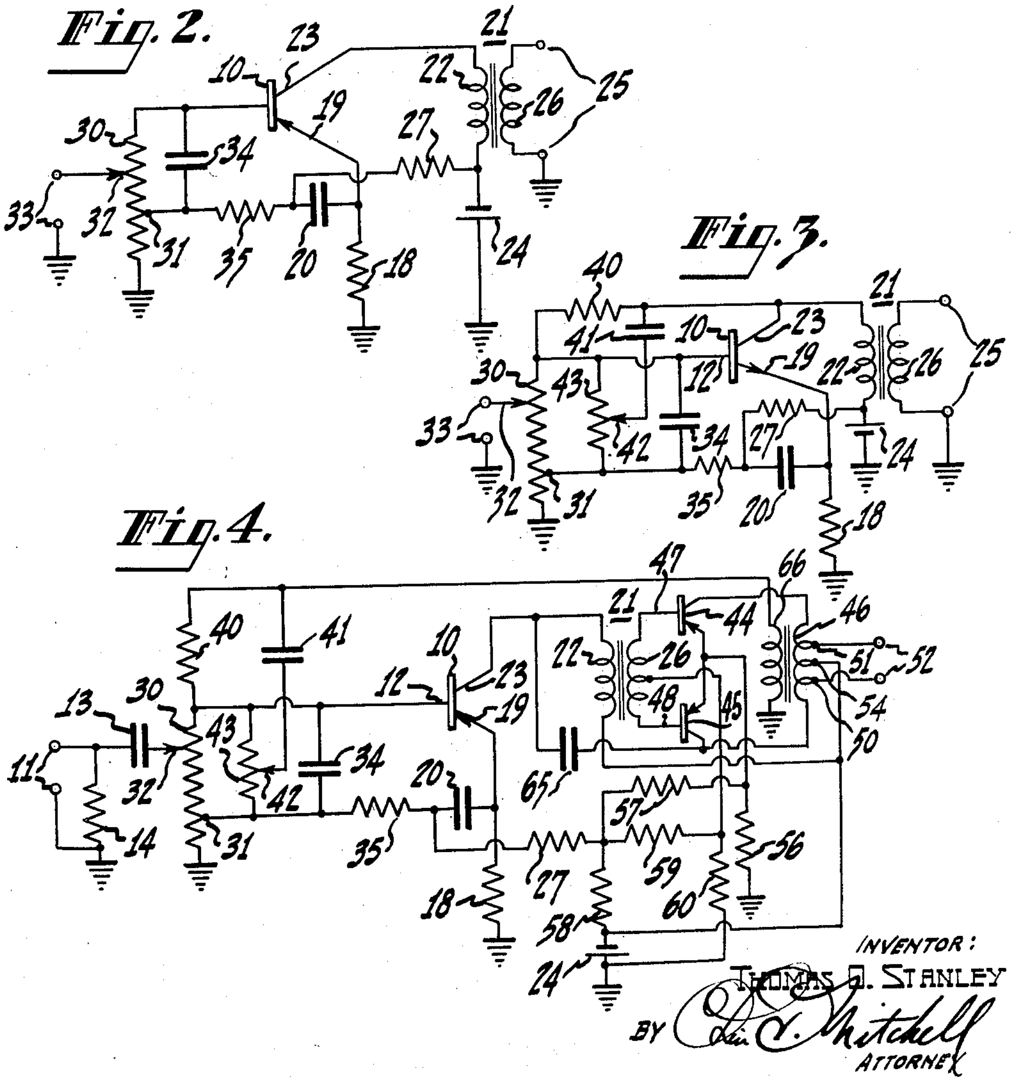
Figure 2 is a schematic circuit diagram of a transistor signal amplifier including a tone compensated signal input network in accordance with the present invention.
Figure 3 is a schematic circuit diagram of a transistor signal amplifier including a tone compensated volume control and feedback tone control in accordance with the present invention.
Figure 4 is a schematic circuit diagram of an audio frequency signal amplifier circuit incorporating the coupling network illustrated in Figure 3.

The addition of tone compensation and volume control is illustrated in Figure 2. The bias resistors 16 and 17 have been replaced by a volume control illustrated as a tapped potentiometer 30 having a fixed tap 31 and an adjustable slider 32. Potentiometer 30 is connected between the base electrode 12 and ground. A suitable signal is applied to adjustable slider 32 through input terminals 33. A capacitor 34 is connected between the tap 31 and the base electrode 12 in order to establish a time constant which is effective, in combination with the resistor 35 and the capacitor 20, to control the tone compensation characteristics.

At a maximum volume control setting, that is, when the slider is adjusted to be near the ungrounded end of the potentiometer 30, the effects of the resistor 35 and the capacitor 34 are negligible. At a maximum volume control setting, the transmission characteristics of the transistor input circuit is essentially flat down to the low frequency cut-off determined by the capacitor 20 and the sum of the resistors 18 and 35 and the resistance lying between the tap 31 and signal ground. The low frequency cut-off is proportionally increased in accordance with the direct current degeneration. When the volume controls slider is near the tap 31, the major portion of the input current flows through the resistor 35 and the capacitor 20, developing a voltage which is constant at frequencies lying above the frequency determined by capacitor 20 and resistor 35, and which increases at 6 db per octave with decreasing frequency. The total impedance in the path of current flowing from the source into the base electrode 12 is equal to the sum of the impedance provided by the parallel combination of that portion of the potentiometer 30 lying between the tap 31 and the base electrode 12, the capacitor 34 and the input impedance of the transistor 10. As frequency increases this total impedance begins to decrease linearly at a frequency determined by the frequency at which the impedance of the capacitor 34 becomes effectively small.

The transmission response characteristics of the transistor input circuit is essentially flat between the frequency limits determined by the RC networks and increases above and below these limits. This is the type of characteristic necessary to compensate for the response provided by the human ear in order to provide equal loudness throughout the audible frequency spectrum.

At volume settings between the tap 31 and the ground, the transmission characteristics change only in magnitude. At volume settings between the tap 31 and the ungrounded or base electrode end of the potentiometer 30, the transmission characteristics assume a shape intermediate the tone compensated characteristic and flat depending on the intermediate setting.

In Figure 3, there is illustrated an audio signal transistor amplifier which includes a tone compensated volume control and a feedback type of tone control. The tone control circuit includes a feedback resistor 40 and a capacitor 41. Feedback resistor 40 is connected between the collector electrode 23 and the base electrode 12. Capacitor 41 is connected between the collector electrode 23 and a tap 42 on a potentiometer 43. Potentiometer 43 is connected between the base electrode 12 and the tap 31.

The operation of the circuit shown in Figure 3 is essentially the same as the operation of the circuit shown in Figure 2 except for the tone control portion of the circuit. The feedback tone control circuit is effective to adjust the transmission characteristics of the networks in accordance with the adjustment of the slider 42 on the potentiometer 43. The signal developed at the collector electrode 23 is applied to the base electrode 12 in an amount determined by the adjustment of the slider 42 and at a maximum tone setting the feedback signal is effective to reduce the transmission characteristic above a frequency determined by the time constant of capacitor 41 and the resistor 40. At intermediate tone control settings, the feedback current flowing through the capacitor 41 is only partially applied to the base electrode 12 and the transmission characteristics then exhibits a high frequency cut-off.

In Figure 3, the transistor 10 is of the NPN variety thereby requiring that the battery 24 be poled in a reverse direction from that illustrated in Figures 1 and 2. Either PNP or NPN transistors may be utilized in any one of the circuit configurations illustrated. It is important, however, that the proper polarity of biasing be provided for the type of transistor used. An audio frequency signal amplifier is illustrated in Figure 4. The driver stage is essentially the same as the signal amplifier stage illustrated in Figure 3.

The output stage comprises a pair of transistors 44 and 45 connected in push-pull with auto-transformer 46. An output signal is developed at taps 50 and 51 which depends upon the input signal applied to the base electrodes 47 and 48 from the secondary winding 46. A loud speaker or other sound reproducing device may be connected to taps 50 and 51 through terminals 52. Collector electrode current for the transistors 44 and 45 is provided through a center tap 54 on the auto transformer 46 which is connected directly to the negative terminal of the battery 24.

A temperature sensitive bias is provided by means of a bias network including an emitter resistor 56, a temperature sensitive impedance element such as a thermistor 57, and a series resistor 58. Static direct current bias for the base electrodes 47 and 48 is provided by means of a pair of resistors 59 and 60 which are connected in series between signal ground and the junction of the resistor 58 and the thermistor 57. The center tap on the secondary winding 26 of the driver transformer 21 is connected directly to the junction of the base bias resistors 59 and 60 thereby providing a base bias current which is dependent upon the resistance of thermistor 57. This bias network is also utilized to establish a static base bias current for the transistor 10 through the voltage dropping resistor 27. The voltage dropping resistor 27 is connected between the junction of the resistor 35 and the capacitor 20 and the junction of the resistor 58 and the thermistor 57.

A negative feedback circuit is provided by capacitor 65 connected between one terminal of the auto transformer 46 and the collector electrode 23 of the driver transistor 10. The feedback circuit reduces the possibility of oscillation over the entire circuit due to regenerative feedback coupling. Transformer winding 66 furnishes the feedback current which is utilized to effect one control. Transformer winding 66 is connected between signal ground and the junction of the feedback resistor 40 and the feedback capacitor 41.

An input signal applied to the input terminals 11 provides an input current for the transistor 10 having a characteristic with respect to frequency and intensity depending on the adjustment of the sliders 32 and 42. The adjustment of the sliders 32 and 42 respectively provide tone compensated volume control and tone control. An amplified signal current is provided in the output circuit of the transistor 10 and is applied to the base electrodes 47 and 48 of the output transistors to establish in the auto transformer 46 a further amplified signal current which may be utilized to drive a loud speaker or other appropriate sound reproducing device.

The operation of the tone compensated volume control is such as to provide an essentially flat response when the control is adjusted for maximum signal translating efficiency and the feedback tone control operates to provide a frequency selective degenerative current to reduce the high frequency gain of the system in accordance with the tone control adjustment.

The coupling circuit designed in accordance with the teachings of the present invention provides efficient coupling while maintaining stable operation of the associated transistor amplifiers. Furthermore, the circuit may be adapted to provide a tone compensated volume control and an adjustable tone control with a minimum of circuit elements while enabling efficient coupling and providing stability of operation.

Having thus described the present invention, what is claimed is:

1. A signal amplifier circuit comprising, in combination, a transistor having base, emitter, and collector electrodes, means providing a signal input circuit having a first terminal and a second terminal connected to a point of reference potential in said circuit, resistive impedance means connected between said base electrode and said point of reference potential, means connecting said first terminal to a variable tap point on said resistive impedance means for coupling signals from a signal source to said base electrode, a first resistor connected between said emitter electrode and said point of reference potential to provide direct-current degeneration and operating point stabilization of said circuit, a by-pass capacitor and a second resistor connected in series in the order named from said emitter electrode to an intermediate point of said resistive impedance means, said capacitor being effective to prevent alternating current degeneration across said first resistor, the nature and magnitude of said resistive impedance means and said first resistor relative to the impedance of said signal source providing with said capacitor efficient signal coupling substantially without signal degeneration from said source to said base electrode, capacitive means connected from said base electrode to said intermediate point and providing with said second resistor and said by-pass capacitor a time constant effective to control the tone compensation characteristics of said amplifier circuit, and means providing a signal output circuit connected between said collector and emitter electrodes.

2. A signal amplifier circuit comprising, in combination, a transistor having base, emitter, and collector electrodes, means providing a signal input circuit having a first terminal and a second terminal connected to a point of reference potential in said circuit, resistive impedance means connected between said base electrode and said point of reference potential, means connecting said first terminal to a variable tap point on said resistive impedance means for coupling signals from a signal source to said base electrode, a first resistor connected between said emitter electrode and said point of reference potential to provide direct-current degeneration and operating point stabilization of said circuit, a by-pass capacitor and a second resistor connected in series in the order named from said emitter electrode to an intermediate point of said resistive impedance means, said capacitor being effective to prevent alternating current degeneration across said first resistor, the nature and magnitude of said resistive impedance means and said first resistor relative to the impedance of said signal source providing with said capacitor efficient signal coupling substantially without signal degeneration from said source to said base electrode, capacitive means connected from said base electrode to said intermediate point and providing with said second resistor and said by-pass capacitor a time constant effective to control the tone compensation characteristics of said amplifier circuit, a third resistor connected in parallel with said capacitive means between said base electrode and said intermediate point, a feedback capacitor connected between said base electrode and a point on said third resistor, a feedback resistor connected between said collector and base electrodes, said feedback capacitor and resistor providing feedback tone control for said amplifier circuit, and means providing a signal output circuit connected between said collector and emitter electrodes.

References Cited in the file of this patent

UNITED STATES PATENTS

| | | |
|---|---|---|
| 2,352,931 | Austin | July 4, 1944 |
| 2,435,331 | Street | Feb. 3, 1948 |
| 2,554,279 | Tharp | May 22, 1951 |
| 2,571,112 | Cowles | Oct. 16, 1951 |
| 2,605,409 | Forbes | July 29, 1952 |
| 2,657,363 | Broos | Oct. 27, 1953 |
| 2,721,908 | Moe | Oct. 25, 1955 |

OTHER REFERENCES

Mallory-Yaxley: "Radio Service Encyclopedia," page 120, Fig. 96.

Shea: "Transistor Circuits," John Wiley & Sons, Inc., copyright 1953 (particularly Fig. 6.11, p. 120).